United States Patent
Bobier et al.

(10) Patent No.: US 8,081,707 B2
(45) Date of Patent: Dec. 20, 2011

(54) CARRIER LESS MODULATOR USING SAW FILTERS

(75) Inventors: Joseph A. Bobier, Sunrise, FL (US); Nadeem A. Khan, Sunrise, FL (US)

(73) Assignee: XG Technology, Inc., Sarasota, FL (US)

( * ) Notice: Subject to any disclaimer, the term of this patent is extended or adjusted under 35 U.S.C. 154(b) by 725 days.

(21) Appl. No.: 11/716,279

(22) Filed: Mar. 9, 2007

(65) Prior Publication Data

US 2007/0210880 A1     Sep. 13, 2007

Related U.S. Application Data

(60) Provisional application No. 60/781,718, filed on Mar. 13, 2006.

(51) Int. Cl.
*H04L 27/00* (2006.01)

(52) U.S. Cl. ........ 375/295; 375/257; 375/259; 375/285; 375/299; 375/316; 455/91; 455/101; 370/205

(58) Field of Classification Search .......... 375/135–138, 375/141–147, 219–222, 243, 249, 257, 260, 375/306, 295, 299, 259, 130, 150, 151, 258, 375/316, 350, 377
See application file for complete search history.

(56) References Cited

U.S. PATENT DOCUMENTS

| | | | |
|---|---|---|---|
| 5,812,598 A * | 9/1998 | Sharma et al. ............... 375/259 |
| 6,505,032 B1 * | 1/2003 | McCorkle et al. ........... 455/41.2 |
| 6,541,893 B2 * | 4/2003 | Zhu et al. .................. 310/313 B |
| 6,788,957 B1 * | 9/2004 | Recouly et al. ............ 455/552.1 |
| 6,970,496 B1 * | 11/2005 | Ben-Bassat et al. .......... 375/141 |
| 7,443,337 B2 * | 10/2008 | Jaklitsch ...................... 342/195 |
| 2002/0154620 A1 * | 10/2002 | Azenkot et al. ............... 370/347 |
| 2003/0026351 A1 * | 2/2003 | Hunton ......................... 375/295 |
| 2004/0151237 A1 | 8/2004 | Ferry et al. |

* cited by examiner

*Primary Examiner* — Hirdepal Singh
(74) *Attorney, Agent, or Firm* — Dennis L. Cook, Esq.

(57) ABSTRACT

A system and method of carrier less modulation is described in this disclosure that uses SAW filters as a modulator in addition to their conventional use as filters for band limiting an UWB system. This system and method is primarily designed to be used with any integer cycle, ultra-wide band or impulse type modulation and more particularly is designed to work with a method of modulation named xMax. This technique exploits the impulse response of the SAW filter producing a carrier less impulse radio system with limited bandwidth, low average power, but high peak power.

1 Claim, 2 Drawing Sheets

Block diagram of modulator

Figure 1: Frequency response of SAW filter
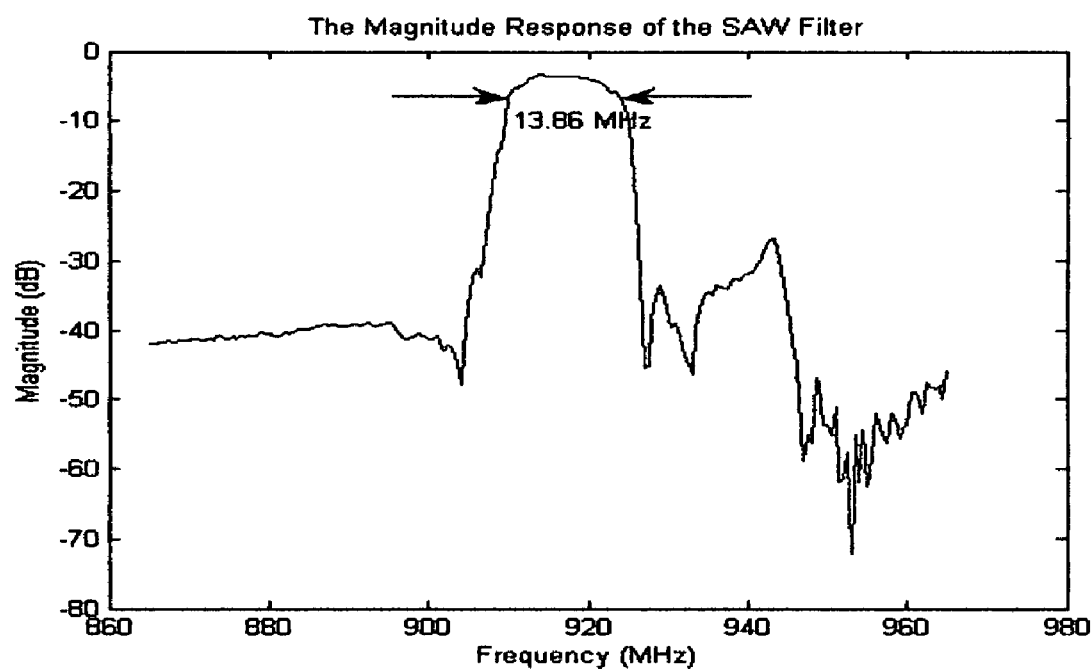
Figure 2: Dirac Delta Function
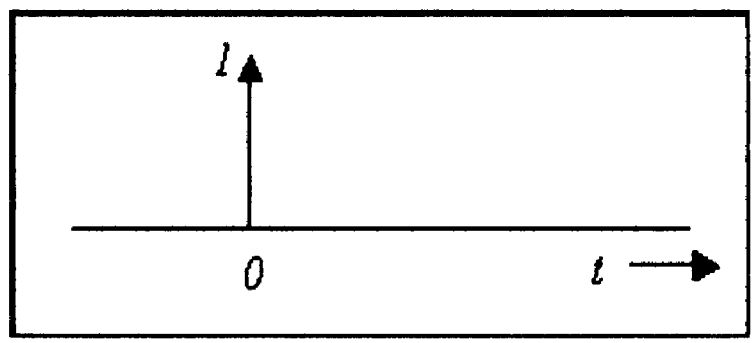

Figure 3: Impulse Response of 14MHz SAW filter
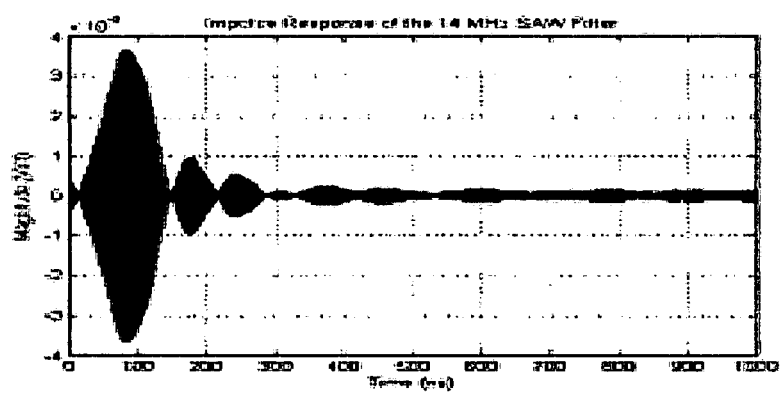
Figure 4: Block diagram of modulator
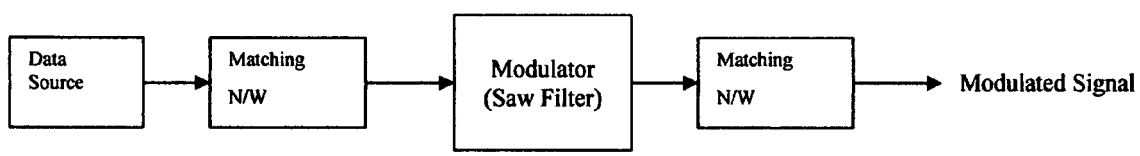

CARRIER LESS MODULATOR USING SAW FILTERS

CROSS-REFERENCE TO RELATED APPLICATION

The present application claims the benefit of previously filed Provisional Patent Application Ser. No. 60/781,718.

FIELD OF THE INVENTION

This invention addresses the need to transport high bit-rate data over wired or wireless means using specially modulated radio frequency carrier waves. Specifically, a technique is described in this disclosure that uses SAW filters as a modulator in addition to their conventional use as filters. This technique exploits the impulse response of the SAW filter producing a carrier less impulse radio system with limited bandwidth, low average power, but high peak power.

BACKGROUND OF THE INVENTION

Modulation is the fundamental process in any communication system. It is a process to impress a message (voice, image, data, etc.) on to a carrier wave for transmission. A band-limited range of frequencies that comprise the message (baseband) is translated to a higher range of frequencies. The band-limited message is preserved, i.e., every frequency in that message is scaled by a constant value. The three key parameters of a carrier wave are its amplitude, its phase and its frequency, all of which can be modified in accordance with an information signal to obtain the modulated signal.

There are various shapes and forms of modulators. For example conventional Amplitude Modulation uses a number of different techniques for modulating the amplitude of the carrier in accordance with the information signal. These techniques have been described in detail in "Modern Analog and Digital Communication Systems" by B. P. Lathi. Similarly conventional Frequency/Phase Modulation uses a number of different methods described in a number of textbooks. In all these techniques, carrier (which is a high frequency sinusoidal signal) characteristics (either amplitude, frequency, phase or combination of these) are changed in accordance with the data (or information signal). Thus there have been two major components of a modulator. One is the information-carrying signal and the other is the high frequency carrier. An unconventional modulator is described in this document that does not use a carrier for modulation. Modulation is accomplished by exploiting the impulse response of Band Pass Filters.

In a communication system band pass filters are used to band limit the bandwidth of the signal. For example, they are used in transmitters to allow necessary signal to pass to the next stage and in receivers they are used to block any unwanted signal. They are an integral part of any communication system and have numerous advantages. Band Pass filters come in many shapes and forms. Most of the communication systems these days use SAW (Surface Acoustic Wave) filters. SAW filters are band pass filters. They use a piezoelectric crystal substrate with deposited gold electrodes. SAW filters are capable of replacing discrete LC band pass filters in certain wideband applications between 20 MHz and 1 GHz. Their filter skirts, or shape factor, are the sharpest of all the filter structures. Since they are etched on a printed circuit board, they save a lot of circuit board real estate and are thus easier to implement. The primary use of SAW filters (as the name implies) is to filter unnecessary signals such as band limiting a transmitter output. A technique is described in this document that uses SAW filters as a modulator in addition to their conventional use as filters. This technique exploits the impulse response of the SAW filter producing a carrier less impulse radio system with limited bandwidth, low average power, but high peak power.

Communication systems that have emerged in recent years included monopulse and Ultra-Wide Band communication systems. The problem with these systems is that all monopulse or Ultra-Wide Band communications systems form Power Spectrum Densities that tend to span very wide swaths of the radio spectrum. For instance the FCC has conditionally allowed limited power use of UWB from 3.2 GHz to 10 GHz. These systems must make use of very wide sections of radio spectrum because the transmit power in any narrow section of the spectrum is very low. Generally any 4 KHz section of the affected spectrum will contain no more than −42 dbm of UWB spectral power. Correlating receivers are used to "gather" such very wide spectral power and concentrate it into detectable pulses. Interfering signals are problematic. Since the communication system is receiving energy over a very wide spectrum, any interfering signal in that spectrum must be tolerated and mitigated within the receiver. Many schemes exist to mitigate the interference. Some of these include selective blocking of certain sections of spectrum so as not to hear the interferer, OFDM schemes that send redundant copies of the information in the hope that at least one copy will get through interference, and other more exotic schemes that require sophisticated DSP algorithms to perform advanced filtering. In addition, UWB systems have somewhat of a "bad reputation" because they at least have the potential to cause interference. A heated discourse has gone on for years over the potential that UWB systems can cause interference to legacy spectrum users.

Tri-State Integer Cycle Modulation (TICM) and other Integer Cycle Modulation techniques, which have now become known by their commercial designation, xMax, were designed by the inventors of this application to help alleviate this massive and growing problem. Its signal characteristics are such that absolute minimal sideband energy is generated during modulation but power spectrum density is quite wide relative to the information rate applied. Also, a narrower section of the power spectrum output can be used to represent the same information. The technique of modulation disclosed herein is primarily applicable to these types of single cycle systems.

Like any other band pass filters, SAW filters also have an impulse response. The impulse response depends on the bandwidth of the filter. A technique is described in this disclosure that uses the impulse response of the filter to modulate the incoming data signal without using a carrier for modulation producing an impulse radio system with limited bandwidth, low average power, but high peak power.

BRIEF SUMMARY OF THE INVENTION

The invention disclosed in this application uses any integer cycle or impulse type modulation and more particularly is designed to work with a method of modulation named Tri-State Integer Cycle Modulation (TICM) which has been previously disclosed in U.S. Pat. No. 7,003,047 issued Feb. 21, 2006, filed by one of the inventors of this disclosure. In a communication system, band pass filters are used to band limit the bandwidth of the signal. For example, they are used in transmitters to allow the necessary signal to pass to the next stage and in receivers they are used to block any unwanted signal. They are an integral part of any communication system and have numerous advantages. Band Pass filters come in many shapes and forms. Most of the communication systems these days use SAW (Surface Acoustic Wave) filters. SAW filters are band pass filters. Their filter skirts, or shape factor, are the sharpest of all the filter structures. The primary use of SAW filters (as the name implies) is to filter unnecessary signals and they are commonly used for band limiting a transmitter output. A technique is described in this document that uses SAW filters as a modulator in addition to their conventional use as filters. This technique exploits the impulse response of the SAW filter producing a carrier less impulse radio system with limited bandwidth, low average power, but high peak power.

For a fuller understanding of the nature and objects of the invention, reference should be made to the following detailed description taken in connection with the accompanying drawings.

DESCRIPTION OF THE DRAWINGS

For a fuller understanding of the nature and objects of the invention, reference should be made to the accompanying drawings, in which:

FIG. 1 is a representation of typical frequency response of a SAW filter;

FIG. 2 is a representation of a Diac Delta Function;

FIG. 3 is a representation of an impulse response of a SAW filter;

FIG. 4 is a block diagram of a modulator.

DETAILED DESCRIPTION OF THE INVENTION

The invention disclosed in this application uses any integer cycle, ultra-wide band, or impulse type modulation and more particularly is designed to work with a method of modulation named xMax which has been described above.

Consider a SAW filter centered at 915 MHz with a bandwidth of 14 MHz. This type of SAW filter is commonly used for ISM 900 MHz applications like cordless phones, low power transmitters etc. The frequency response of this SAW filter is shown in FIG. 1. While the frequency response of the filter gives no information about the impulse response of such filter, we have to calculate the impulse response of this filter.

The impulse response of a filter is usually derived by passing a dirac delta signal (simply known as delta function) at the input of the SAW filter. The Delta function is defined as: The Dirac Delta function, often referred to as the unit impulse or delta function, is the function that defines the idea of a unit impulse. This function is one that is infinitesimally narrow, infinitely tall, yet integrates to unity, one. This function can be visualized as shown in FIG. 2.

When such a signal is applied to a SAW filter (described above), an output signal is formed as shown in FIG. 3. From FIG. 3, it is clear that the output of the SAW filter starts at time t=0, grows to a peak amplitude at time t=80 nsec and then starts falling. This process is repeated for a number of times. Even though the input is applied for a very short amount of time, the signal at the output of the SAW filter remain for at least 148.5 nsec. In other words, the SAW filter rings for 148.5 nsec. The wider the bandwidth of SAW filter, the less is the ringing time and vice versa. A frequency domain analysis of FIG. 3 reveals that there are a number of frequencies present when a Dirac input is applied to the SAW filter. These frequencies lie within the bandwidth of the SAW filter. Even though the input signal is a unit impulse signal, (frequency=infinite as time=0 as shown in FIG. 2) the output signal has frequency contents that are within the bandwidth of the SAW filter. Therefore in a single cycle system like xMax, instead of modulating the signal (using either digital or analog means) and then passing it through SAW filters, one can apply the signal straight from the encoder to the SAW filter. The impulse response of SAW filter will convert encoded data into a modulated signal that can then be applied to other signal processing blocks like amplifiers, filters, etc.

Theoretically the Dirac Delta Function or unit impulse signal cannot be fabricated in real life. So, instead of applying a unit impulse signal, a short pulse (pulse width 1.07 nsec) is applied to SAW filter. The output of the SAW filter produces a similar modulated waveform as shown in FIG. 3. The duration of the modulated signal depends on the bandwidth of the SAW filter. For example a 17 MHz SAW filter would produce a narrower modulated signal as compared to a 14 MHz SAW filter. The duration of the input pulse plays a role in the modulated signal amplitude. For example a 1 nsec input pulse will produce a smaller amplitude output signal as compared to 2.5 nsec input pulse.

A block diagram of such a modulator implementing this invention in a preferred embodiment is shown in FIG. 4 and is made up of the following components:

Data Source: The Data source provides encoded data such as Index-N data (as disclosed in the patent "Modulation compression method for the radio frequency transmission of high speed data", U.S. Pat. No. 7,023,932) used in the xMax system as discussed above. The data could be single ended or differential. The data format could either be NRZ (Non Return to Zero) or RZ (Return to zero). The peak-to-peak amplitude of this signal can either be programmable of fixed. Since it is a digital signal, it can be TTL, CMOS, ECL, PECL, LVDS or any other logic family data.

Matching Network: There are two matching networks. One is placed at the input of the SAW filter called "Input Matching Network" and the other one is placed at the output and called "Output Matching Network". The Input-Matching Network transforms the impedance of the data source into the input impedance of the SAW filter. It is also used to convert differential data output into single ended output. Similarly the Output-Matching Network performs impedance transformation from the SAW filter to the next stage. Matching networks can be implemented using either a discrete component or an active network.

Saw filter: Any SAW filter with appropriate bandwidth and appropriate impulse response can be used as the modulator.

The following are the advantages of this kind of modulator: Modulation is accomplished without the use of a local oscillator; system cost is reduced; system complexity is reduced; Real Estate used on the printed circuit board is minimized; and, overall system power requirements are reduced as SAW filters are passive devices.

Since certain changes may be made in the above described RF signal modulation system and method without departing from the scope of the invention herein involved, it is intended that all matter contained in the description thereof or shown in the accompanying figures shall be interpreted as illustrative and not in a limiting sense.

What is claimed is:

1. A method of generating a carrier less impulse modulated Radio Frequency signal comprising:

Receiving a carrier less digital signal from a digital encoder data source and applying said carrier less digital signal to the input of an un-switched Band Pass Filter;

using the impulse response of said un-switched Band Pass Filter to generate the carrier less impulse modulated Radio Frequency signal having an impulse for each short pulse inputted by said digital encoder data source and no impulse for an absence of short pulse inputted by said digital encoder data source, without an oscillator or signal generator generating a radio frequency carrier signal, said carrier less impulse modulated Radio Frequency signal having limited bandwidth, low average power, but high peak power; and matching the impedance of said digital encoder data source to the input impedance of said un-switched Band Pass Filter and matching the impedance of the output of said un-switched Band Pass Filter to other stages of a radio system used for amplifying and transmitting said carrier less impulse modulated Radio Frequency signal, wherein said un-switched Band Pass Filter is a SAW (Surface Acoustic Wave) filter.

* * * * *